United States Patent
Ribo et al.

(10) Patent No.: US 7,349,509 B2
(45) Date of Patent: Mar. 25, 2008

(54) MULTI RATE CLOCK DATA RECOVERY BASED ON MULTI SAMPLING TECHNIQUE

(75) Inventors: Jerome Ribo, San Jose, CA (US); Benoit Roederer, Cupertino, CA (US)

(73) Assignee: Kawasaki LSI U.S.A., Inc., San Jose, CA (US)

( * ) Notice: Subject to any disclaimer, the term of this patent is extended or adjusted under 35 U.S.C. 154(b) by 690 days.

(21) Appl. No.: 10/828,318

(22) Filed: Apr. 21, 2004

(65) Prior Publication Data

US 2005/0238126 A1 Oct. 27, 2005

(51) Int. Cl.
 *H04L 7/00* (2006.01)
(52) U.S. Cl. ............ 375/355; 375/360; 375/371
(58) Field of Classification Search ........ 375/354, 375/355, 360, 371
 See application file for complete search history.

(56) References Cited

U.S. PATENT DOCUMENTS 5,757,297 A * 5/1998 Ferraiolo et al. ........ 341/100

2004/0247049 A1 * 12/2004 Maddux
2005/0069071 A1 * 3/2005 Kim et al.
2005/0180536 A1 * 8/2005 Payne et al.

\* cited by examiner

*Primary Examiner*—Dac V. Ha
(74) *Attorney, Agent, or Firm*—Oliff & Berridge, PLC (57) ABSTRACT

A clock and data recovery device (CDR) based on multi-rate multi-phase oversampling technique is capable of receiving serial data streams of different data rates. The CDR uses a multi-rate multi-phase oversampling technique. N phase shifted clocks are generated based on a single clock and rising edges (or falling) of the phase shifted clocks and define N sampling points where a serial data stream is sampled. The multi-phase oversampling technique provides at least two sampling points per data bit of the serial data stream at highest data rates. The sampling points divide one clock cycle of the single clock into N zones. Depending on which of the zones a data edge transition is detected, the CDR can converge the sampling points to optimal data sampling positions in the serial data stream.

21 Claims, 8 Drawing Sheets

MULTI RATE CLOCK DATA RECOVERY BASED ON MULTI SAMPLING TECHNIQUE

BACKGROUND OF THE INVENTION

1. Field of Invention

The present invention relates to clock and data recovery devices.

2. Description of Related Art

A clock and data recovery device is normally used to receive a serial data stream that does not include a clock signal. Instead, the clock signal is derived from the serial data stream itself. In a transmit/receive system, a serial data stream may be transmitted in continuous or non-continuous (burst) modes and a receiver may receive one or more serial data streams having different data rates using one or more clock and data recovery devices.

SUMMARY OF THE INVENTION

This invention provides a clock and data recovery device (CDR) that is capable of receiving serial data streams of different data rates. The CDR uses a multi-rate multi-phase oversampling technique. N phase shifted clocks are generated based on a single clock and rising edges (or falling) of the phase shifted clocks and define N sampling points where a serial data stream is sampled. The multi-phase oversampling technique provides at least two sampling points per data bit of the serial data stream at highest data rates. The sampling points divide one clock cycle of the single clock into N zones. Depending on which of the zones a data edge transition is detected, the CDR can converge the sampling points to optimal data sampling positions in the serial data stream.

BRIEF DESCRIPTION OF THE DRAWINGS

Various exemplary embodiments of the invention are described in detail with reference to the following figures wherein.

DETAILED DESCRIPTION OF PREFERRED EMBODIMENTS

In serial data communication systems, clock and data recovery devices (CDRs) operate in an environment where the clock frequency at the transmit end and the clock frequency at the receive end are controlled to be within a specified tolerance of each other. However, two clocks rarely, if ever, have the exact identical frequency. Thus, the clocks at the transmit and receive ends may drift from each other during a data transmission. This drift is usually limited to be less than one cycle within a specified period so that the CDR can track any drifts that may occur without requiring a clock to be transmitted with the serial data stream. In addition, there is a need for CDRs that receive data transmitted at different clock rates. This invention provides a CDR that receives serial data streams transmitted at different clock rates without the need for a transmitted clock.

Figure 1:
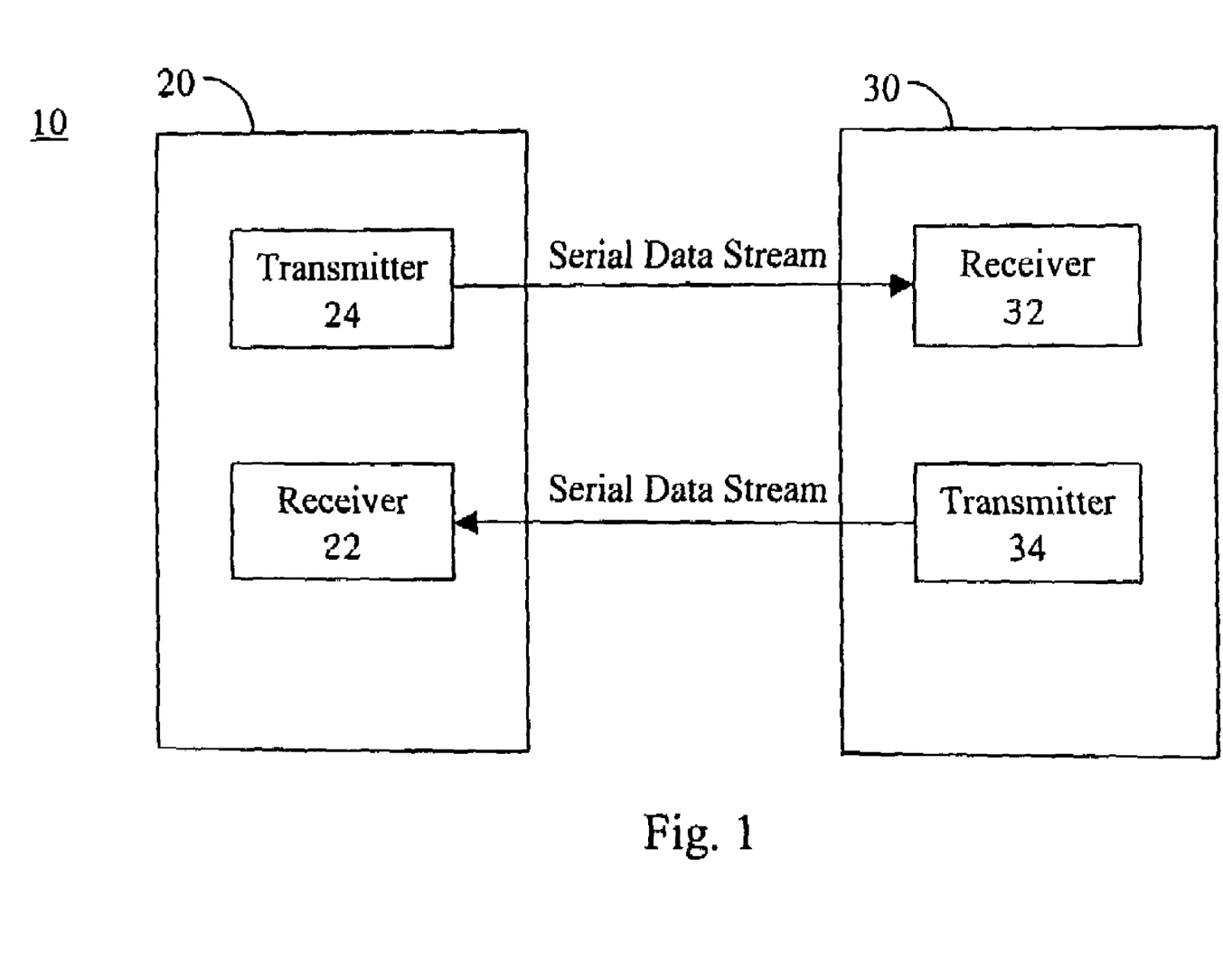
FIG. 1 illustrates an exemplary functional block diagram of a data transmit/receive system.

FIG. 1 shows an exemplary functional block diagram of a data transmit/receive system 10 that includes transceivers 20 and 30 each of which includes a transmitter 24, 34 and a receiver 22, 32, respectively. The transceivers 20 and 30 may be identical to each other (but need not be). For ease of discussion, it is assumed that the transceivers 20 and 30 are identical and only the transceiver 20 is discussed in detail below. The data transmit/receive system 10 may represent various communication systems and networks, computer systems and networks, etc.

Figure 2:
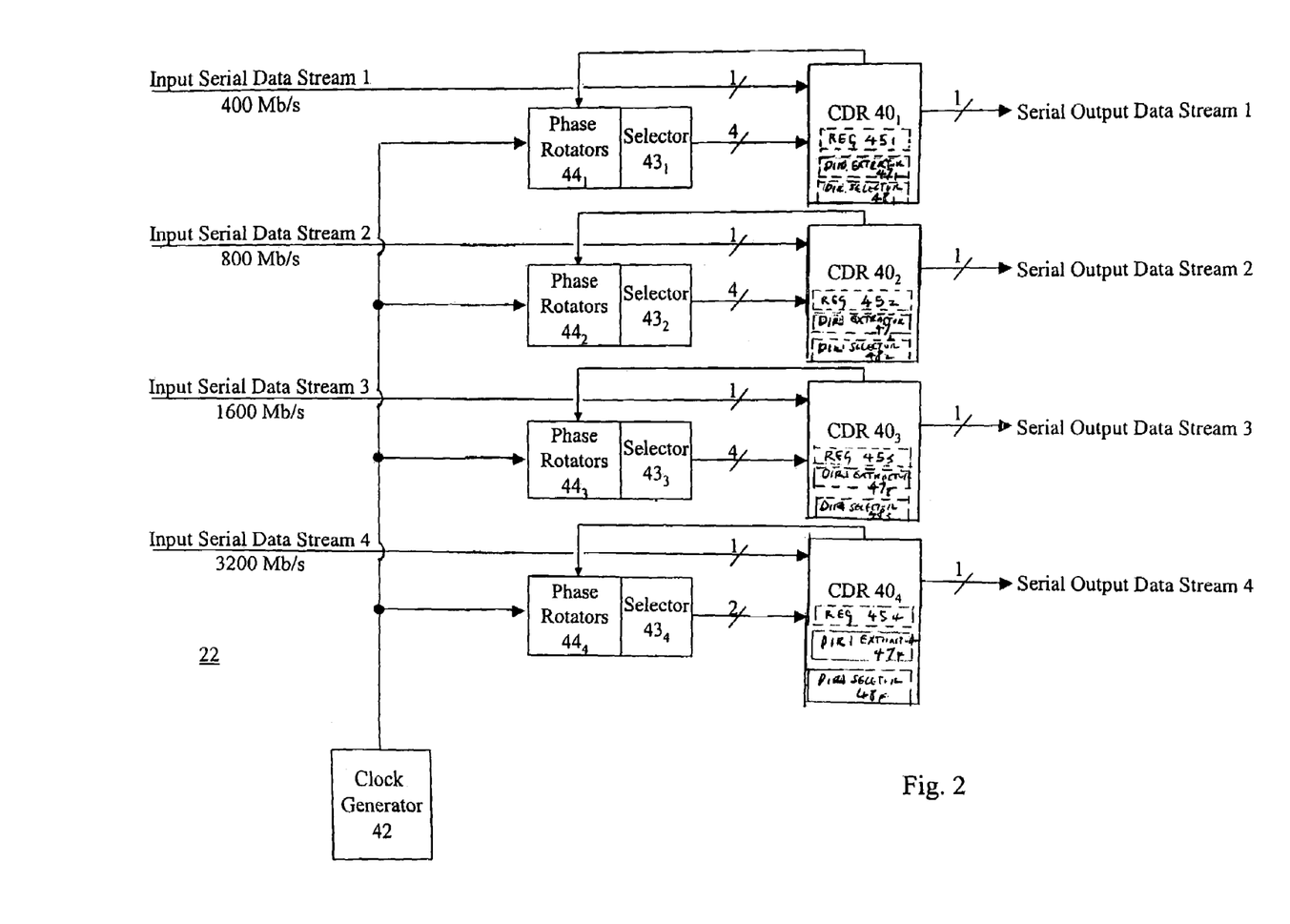
FIG. 2 illustrates a block diagram of an exemplary receiver module of FIG. 1.

As an example, the receiver 22 shown in FIG. 2 includes a clock generator 42, phase rotators $44_1$-$44_4$ and CDRs $40_1$-$40_4$. The CDRs $40_1$-$40_4$ may be configured to receive serial data streams 1-4 at different data rates such as 400 Mb/s, 800 Mb/s, 1600 Mb/s and 3200 Mb/s, for example. The receiver 22 may be configured so that: CDR $40_1$ receives the 400 Mb/s serial data stream 1; CDR $40_2$ receives the 800 Mb/s serial data stream 2; CDR $40_3$ receives the 1600 Mb/s serial data stream 3; and CDR $40_4$ receives the 3200 Mb/s serial data stream 4. Each of the phase rotators $44_1$-$44_4$ receives four clock inputs from the clock generator 42 and outputs four phase shifted clocks. In cases where the phase rotator $44_1$-$44_4$ has a phase interpolator with limited phase shifting capability, a phase selection mechanism may be used to enhance the phase rotators' $44_1$-$44_4$ capability. The phase rotators $44_1$-$44_4$ receive control signals from respective CDRs $40_1$-$40_4$ to adjust phase rotations of the input clock to track drift conditions of the input serial data streams.

In some cases, selectors $43_1$-$43_4$ are provided to either output four, two or one phase shifted clock(s) output by the phase rotators $44_1$-$44_4$ to sample the respective input serial data streams 1-4. The selectors $43_1$-$43_4$ may be controlled by control mechanisms internal or external to the CDRs $40_1$-$40_4$. Thus, for the 1600 Mb/s input serial data stream, all four phase shift clocks clk0-clk3 are selected; for the 800 Mb/s input serial data stream, every other phase shift clocks clk0-clk3 are selected; and for 400 Mb/s input serial data stream, every fourth phase shift clock clk0-clk3 are selected.

In some other cases, for example, involving very high data rates, all four phase shifted clocks may be used to sample the respective input serial data streams 1-4 regardless of the selected data rate. The sampled data bits may be stored in registers $45_1$-$45_4$ within the sampling stage of the CDRs $40_1$-$40_4$. Directive extractors $47_1$-$47_4$ generate directives from the sampled data bits stored in the registers $45_1$-$45_4$. Directive selectors $48_1$-$48_4$ selects the relevant directives according to the rate selected, usually without any penalty on the upper and higher speed. The directive selectors $48_1$-$48_4$ may be multiplexers.

Each of the phase rotators $44_1$-$44_4$ phase shifts the input clock by 0, 90, 180 and 270 degrees, respectively, thus generating four phase clocks clk0-clk3 that are progressively shifted by 90 degrees apart. Additionally, a count value from the counter 54 increments or decrements all the phase shifts by a phase step value. If a least significant bit of the counter 54 is set to correspond to a 6 degree phase step value, then an increment of 1 of the counter 54 results in all the phase shifts to increase by 6 degrees. For example, if a "0" count value results in phase shifts of 0, 90, 180 and 270 degrees, then a "1" count value results in phase shifts of 6, 96, 186 and 276 degrees and a "2" count value results in phase shifts of 12, 102, 192 and 282 degrees. Similarly, a "−1" count value results in 354, 84, 174 and 264 degrees (phase shifts wrap around so that 0 degrees is the same as 360 degrees, i.e., modulo 360). The step value may be set to correspond to any desirable phase step.

Rising (or falling) edges of the phase clocks clk0-clk3 (referred to as sampling points) are used by the CDRs $40_1$-$40_4$ to sample the input serial data stream. As discussed below, a minimum number of samples that a CDR requires is two per clock cycle. Thus, in order to receive an input serial data stream at 3200 Mb/s, the clock generated by the clock generator 42 may be at 1600 MHz because two consecutive phase clocks clk0-clk3 can be used to sample in one data bit while the next two phase clocks clk0-clk3 can be used to sample a next data bit. The CDRs $40_1$-$40_4$ may also use four samples per data bit.

Figure 3:
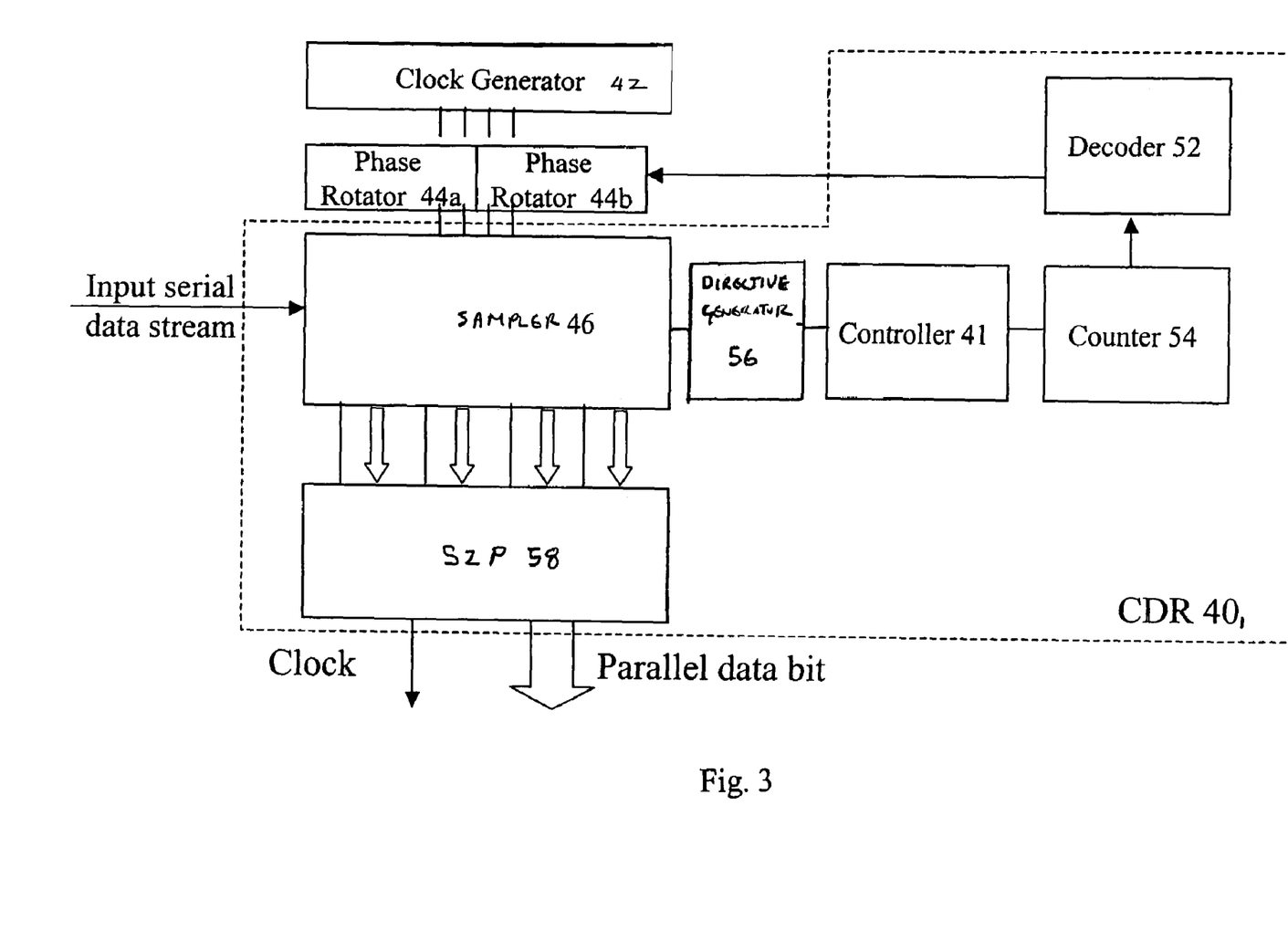
FIG. 3 illustrates an exemplary block diagram of one of the CDRs of FIG. 2.

FIG. 3 is an exemplary block diagram of the CDR $40_1$, which may represent any of the CDRs $40_1$-$40_4$. The CDR $40_1$ includes a sampler 46, a directive generator 56, a controller 41, a decoder 52, a counter 54 and a serial to parallel converter 58. The sampler 46 samples the input serial data stream at the sampling points (i.e., rising or falling edges of phase clocks clk0-clk3) generated by the phase rotator $44_1$ implemented as phase rotators 44a and 44b. The sampled data bits are sent with the recovered clock to the serial to parallel converter 58 for parallel conversion.

The directive generator 56 also receives the sampled data bits and includes comparators, which may be exclusive-OR gates, that compare consecutive adjacent sampled data and generate compare results. In some cases, the directive generator 56 may be integrated with the sampler 46, for example, in situations where very high data rates are involved. A comparator outputs a "1" when consecutive sampled data are different (i.e., "0" and "1") and outputs a "0" when the consecutive sampled data are the same (i.e., both are "0" or "1"). Thus, the comparator results indicate which pair of the sampled data surrounds an edge transition. The directive generator 56 generates directive outputs, i.e., increment/decrement directives based on the comparator results. The directive generator 56's directive outputs are sent to the controller 41. The controller 41 processes the increment/decrement directives and generates increment/ decrement signals that adjust at the appropriate time a counter value of the counter 54. The decoder 52 decodes the counter value and generates control signals to phase shift the phase clocks clk0-clk3.

The directive generator 56 operation may depend on the selected number of sampling points per data bit. The number of comparators used in the directive generator 56 may depend on achieving a desired result. Thus, the number of comparators given below should not be construed as a limitation, but rather, should be construed as aiding in the understanding of the directive generator 56 operation. An operation involving two sampling points per data bit is now described.

Two comparators may be used to compare three consecutive sampled data in a serial data stream to generate two compare results. The directive generator 56 determines whether to output an increment directive or a decrement directive based on whether a first comparator or a second comparator of the two comparators outputs a "1." For example, if the first comparator outputs a "1", this may indicate a phase lead condition where the input serial data stream is drifting to be "slower" than the clock generated by the clock generator 42. Conversely, if the second comparator outputs a "1", this may indicate a phase lag condition where the input serial data stream is drifting to be "faster" than the clock. Thus, when a phase lead condition is detected, the directive generator 56 outputs an increment (up) directive that eventually causes the counter 54 to increase the phase shift (or increase delay) applied by the phase rotators 44a and 44b to move the sampling clocks clk0-clk3 to occur at a later time. When a phase lag condition is detected, the directive generator 56 outputs a decrement (down) directive that eventually causes the counter 54 to reduce the phase shift (i.e., decrease delay) to move the sampling clocks clk0-clk3 to occur at an earlier time.

Figure 4:
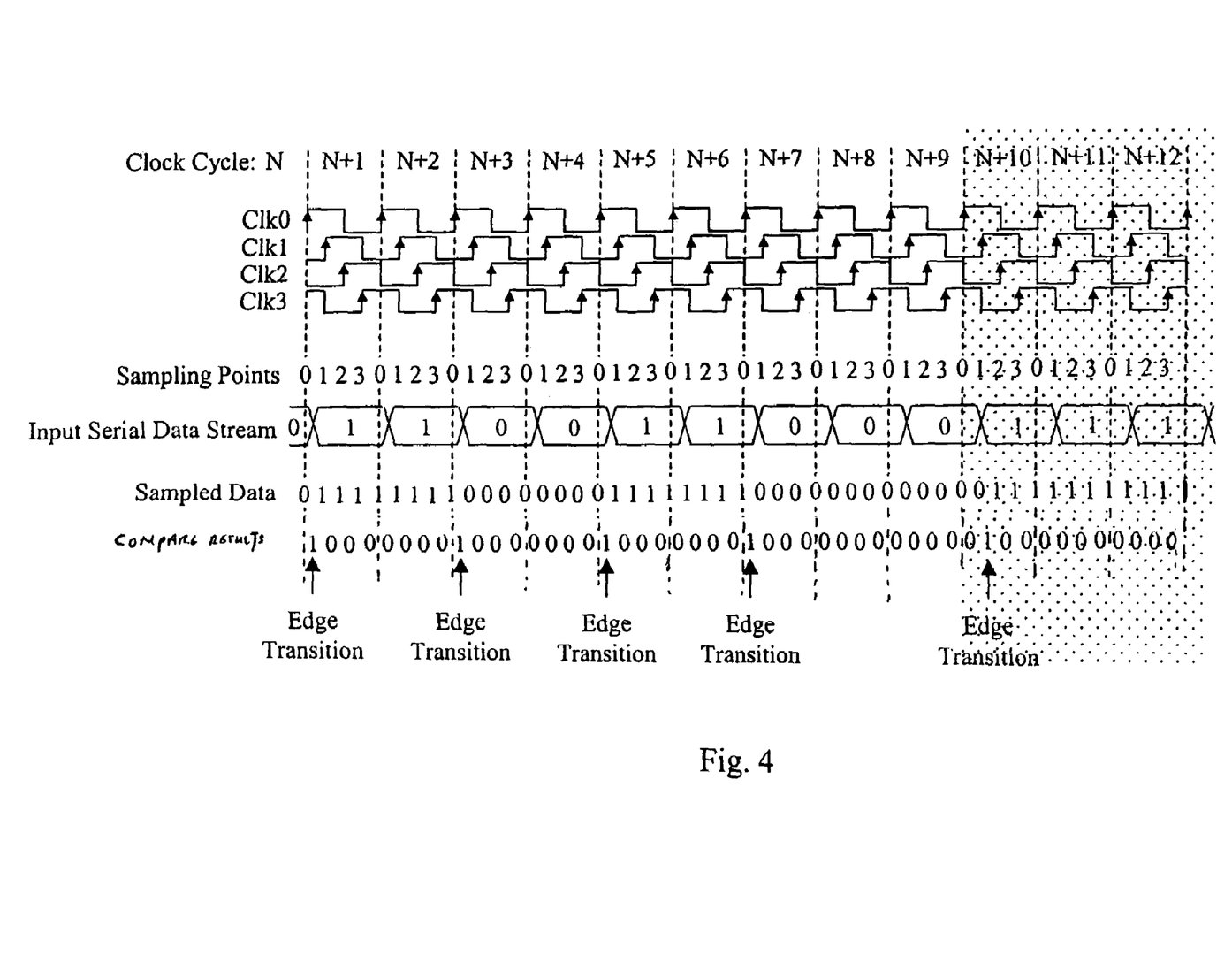
FIG. 4 illustrates an exemplary timing diagram of a CDR operation.

The operation of the directive generator 56 that involves comparing five consecutive sampled data are now described below. FIG. 4 shows the CDR $40_1$ operating using an exemplary input serial data stream. The first row labels the clock cycles of the clock generated by the clock generator 42 starting with N to N+12. The next 4 rows shows the clocks clk0-clk3 outputted by the phase rotators 44a and 44b. Below the clocks clk0-clk3 in the next row are the sampling points 0-3 repeated corresponding to the rising (or falling) edges of the clocks clks0-clks3.

The next row below the sampling points is an exemplary input serial data stream. The data transition points are indicated by the "Xs" and the number between the "Xs" are the data bit values of the input serial data stream. FIG. 4 shows that the input serial data stream has a clock rate that is slightly slower than the clock rate of the clock rate generated by the clock generator 42, because the separation between the "Xs" relative to the sampling point 0 increases as time progresses to the right.

The next row below the input serial data stream are the sampled data obtained by the sampler 46 by sampling the input serial data stream at the sampling points 0-3 shown two rows above. The first sampled data is sampled at clock N+1 at sampling point 0 or (N+1, 0) and has the value of 0 because the sampling point 0 occurs when the data bit is 0 just before the data transition point. The next sampled data is a 1 because sampling point 1 occurs right after the data bit changed to a 1 in a new cycle of the input serial data stream. This process is performed by the sampler 46 continuously during a data transmission.

The row below the sampled data shows compare results of the comparators. For example, four comparators compare five consecutive bits of the sampled data and each comparator generates a 0 if both bits are the same and a 1 if they are different. Thus, the outputs of the comparators are 1000 at (N+1), (N+3), (N+5), (N+7), 0100 at (N+10) and 0000 elsewhere. While FIG. 4 shows the sampling points 0-3 not changed throughout the complete period, the CDR $40_1$ actually adjusts the positions of the sampling points 0-3 to follow the edge transitions. For example, at (N+1) the directive generator 56 detects a "lead" condition and should issue an "up" directive to increment the counter 54, for example, which should result in the phase rotators 44a and 44b adding an additional phase step to the total phase shift (e.g., adding 6 degrees to the current phase shift). This action should move the sampling point 0 closer to the edge transition at a subsequent clock cycle. If a "lag" condition did not result, then the directive generator 56 continues to issue an "up" directive until the "lag" condition occurs, after which the directive generator 56 should issue an "down" directive to decrement the counter 54. This process continues so that the sampling point 0 moves back and forth relative to the edge transition thus keeping the sampling points 0-3 in "sync" with the input serial data stream.

If the above process is properly performed, the condition at (N+10) (far to lock condition) should not occur, because the sampling points 0-3 should have been adjusted to avoid such a condition. However, under conditions where the difference between the clock generated by the clock generator 42 and the input serial data stream is large (during the locking after initialization, or when a burst of data arrive), the situation N+10 may occur. Under this condition, the directive generator 56 may continue to issue an up directive to decrement the counter 54 until a "sync" condition is established. However, under burst transmission conditions, a faster convergence of the sample points 0-3 to the input serial data stream may be desired.

Figure 5:
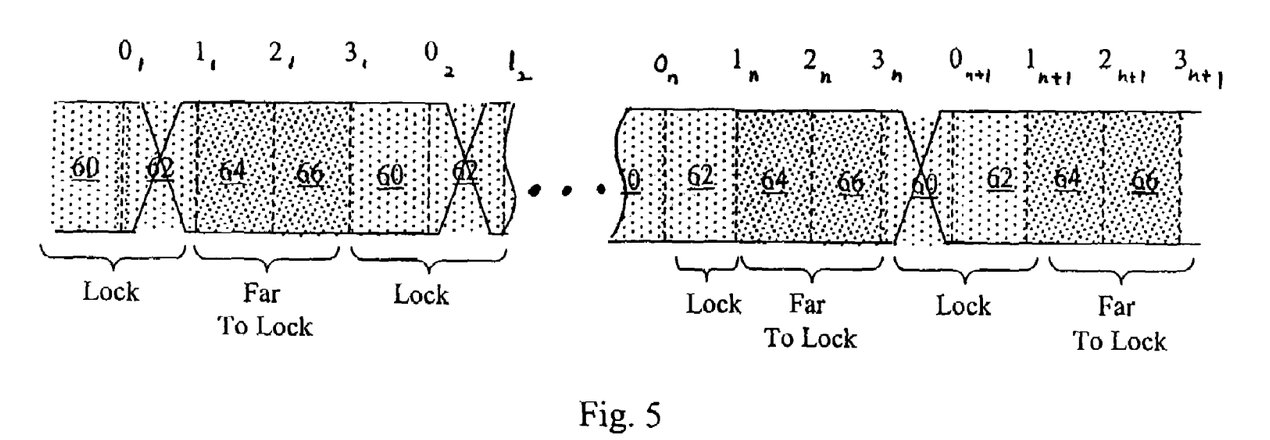
FIGS. 5 and 6 illustrate exemplary clock cycle zones.
Figure 6:
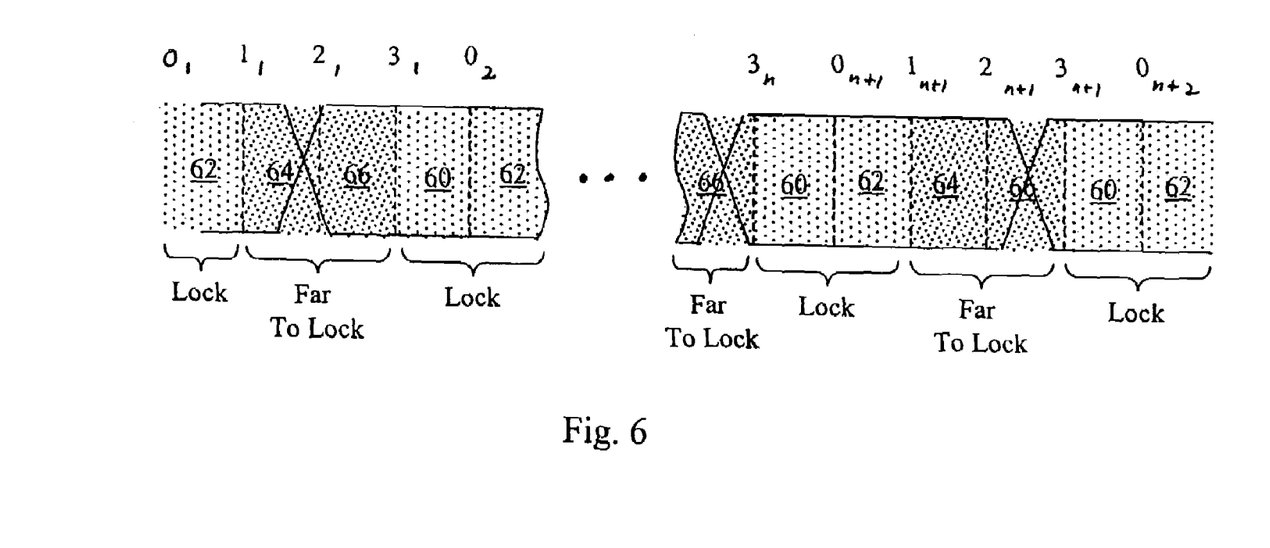

FIGS. 5 and 6 show that the sample points $0_N$-$0_{N+1}$ divide a clock cycle into 4 zones 60-66. Zones 60 and 62 are "lock" zones and zones 64 and 66 are "far-to-lock" zones. When the edge transition occurs within zones 60 and 62, the sampling points 0-3 are within 90 degrees phase shift from a synchronization point with the input serial data stream (FIG. 5). Under this condition, based on the increment/decrement directive of the directive generator 56, the controller 41 may increment/decrement the counter 54 to converge to the synchronization point without resorting to increasing phase step size.

Zones 64 and 66 are far-to-lock zones where the position of the sampling points 0-3 are greater than 90 degrees phase shift from synchronization point, and in some cases, should synchronize quickly (FIG. 6). Thus, when the edge transition occurs in zone 64, the clock generated by the clock generator 42 phase leads the input serial data stream by more than 90 degrees and, in some cases, should quickly increase the phase shift to move the sampling point 0 into the zone 62. Similarly, if the edge transition occurs in the zone 66, the clock generated by the clock generator 42 phase lags the input serial data stream by greater than 90 degrees and, in some cases, should quickly reduce the phase shift for convergence to the synchronization point.

The CDR 40$_1$ may be provided with a fast-to-lock mode where the phase step size may be changed from between 6 to 45 degrees, for example. When enabled, the controller 41 increments/decrements the counter 54 with a value that may be set between this range. For example, the counter 54 may be configured to accept increments/decrements at different bit positions. The controller 41 may enable different increment/decrement positions based on initialization parameters. For example, the parameters may specify that the increment/decrement value should be 24 degrees in the fast-to-lock mode. If the least significant bit of the counter correspond to 6 degrees, then the third bit of the counter 54 is incremented/decremented every time the controller 41 decides to increment/decrement the counter 54.

The controller 41 may be configured to set the phase set size adaptively. For example, if the first time a far-to-lock condition is encountered, the step size may be set to a large value. If the far-to-lock condition is encountered a second consecutive time, the controller 41 may maintain the previous step size until a lock condition is reached where the controller 41 may reduce the step size. Alternatively, the controller 41 may set the step size to a second value. For example, the second value may be set to a greater size than the previous value to increase the speed of converge of the sampling points to the input serial data stream as the number of consecutive far-to-lock conditions occur. In this way, the CDR 40$_1$, may quickly "lock" onto the input serial data stream for burst transmissions, for example.

As noted above, the CDR 40$_1$ may support multiple input serial data stream rates such as 3200 MHz, 1600 MHz, 800 MHz and 400 MHz. For these rates, the clock generator 42 is set to generate clocks at 1600 MHz which results in at least two sampling points per clock cycle for the 3200 MHz rate and four sampling points for all the other rates. The table below shows the correspondence between input serial data stream rates and sampling points.

TABLE 1

|  | Clk0 | Clk1 | Clk2 | Clk3 |
| --- | --- | --- | --- | --- |
| 3200 MHz | Sampling Point 0 | Sampling Point 1 | Sampling Point 0 | Sampling Point 1 |
| 1600 MHz | Sampling Point 0 | Sampling Point 1 | Sampling Point 2 | Sampling Point 3 |
| 800 MHz | Sampling Point 0, 2 | Not Used | Sampling Point 1, 3 | Not Used |
| 400 MHz | Sampling Point 0-3 | Not Used | Not Used | Not Used |

As shown in the table above, there are only two sampling points 0 and 1 for the 3200 MHz rate. Thus, edge transitions of the data in the input serial data stream may occur either between sampling points 0 and 1 or 1 and 0 corresponding to phase lead and phase lag conditions, and the controller 41 increments or decrements the counter 54, respectively. For this input serial data stream rate, only two zones are possible. Thus, only lock zones are supported and the far-to-lock zones are not supported.

For the 1600 MHz to 400 MHz input serial data rates, the clocks clk0-clk3 output by the phase rotators 44$_1$-44$_4$ provide at least four rising (or falling) edges that may correspond to sampling points from which the input serial data stream may be sampled. However, only four sample points are required. Thus, in some cases, the selector 43$_1$ selects the rising (or falling) edges of clk0-clk3 for sampling points 0-3 for sampling the input serial data stream. Once selected, the sampling points 0-3 are used as discussed in detail above to sample the input data stream and the sampled data used to determined whether to increment or decrement the counter 54 based on the comparator results. In some other cases, all four phase shifted clocks clk0-clk3 samples the input serial data stream and the sampled data bits are stored in the register 45$_1$ as discussed above. The directive extractor 47$_1$ uses the sampled data bits to generate directives. The directive selector 48$_1$ selects the relevant directives according to the selected data rate which is used to determine whether to increment or decrement the counter 54.

Figure 7:
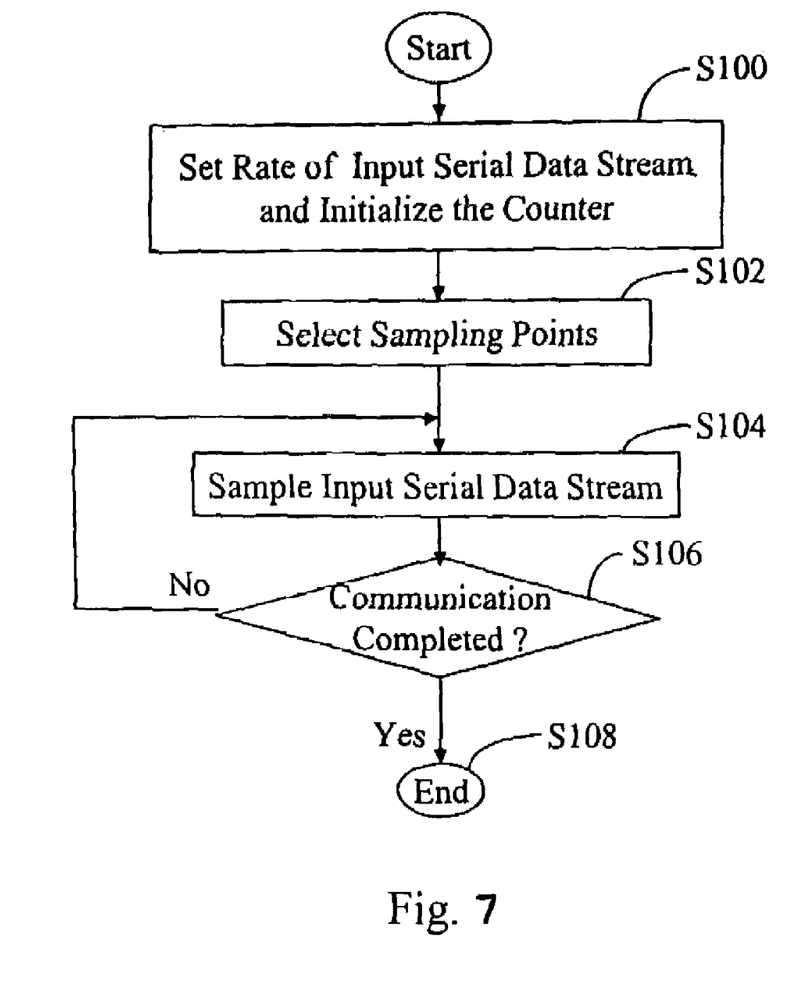
FIGS. 7 and 8 are flowcharts of exemplary CDR initialization and sampling processes.
Figure 8:
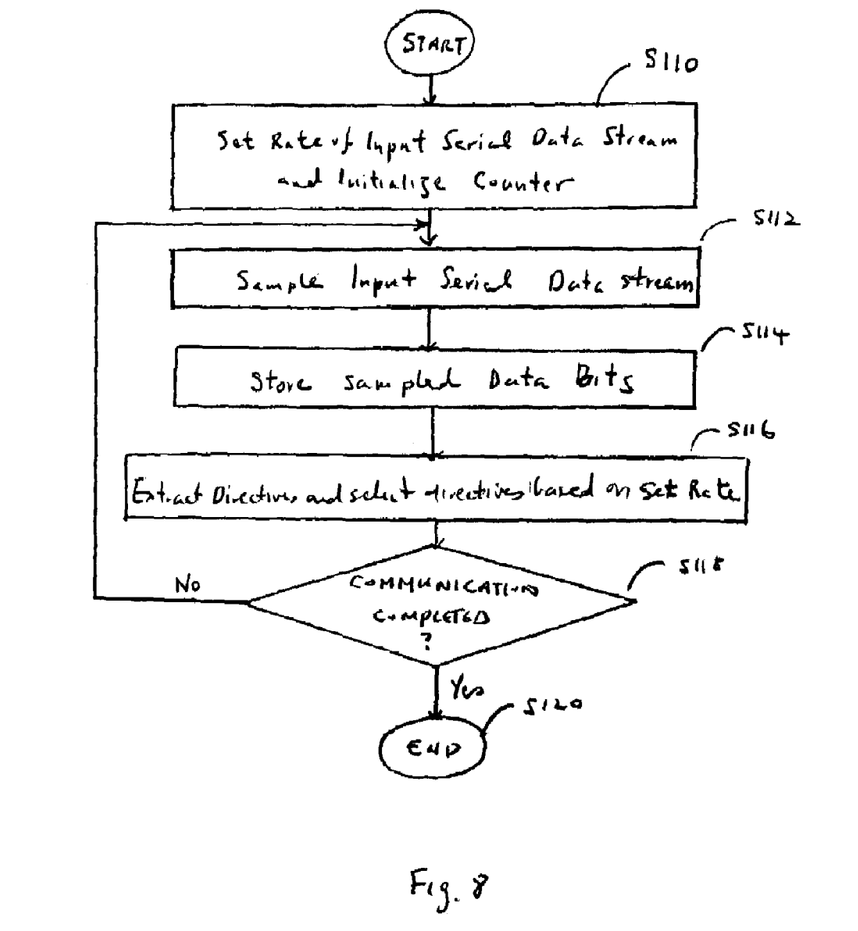
Figure 9:
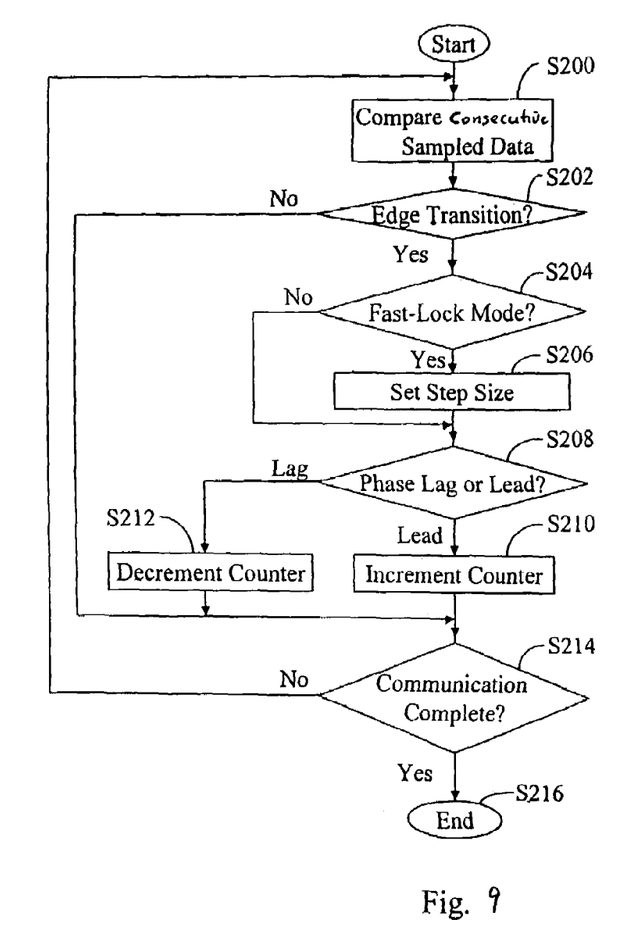
FIG. 9 is a flowchart of an exemplary CDR decision process.

The functions of the CDR may be implemented completely in an application specific integrated circuit (ASIC), PLD, PLA, FPGA or PAL, or the like, for example. FIGS. 7 and 8 show flow charts of exemplary processes of the CDR whether performed in hardware or software.

FIG. 7 shows an flow chart for an exemplary initialization and sampling process of the CDR. In step S100, the process initializes the CDR by setting the expected rate of the input serial data stream and initializes the counter 54 to an initial value. As discussed above, the CDR may be controlled to receive multiple data rates such as 3200 MHz down to 400 MHz, for example. The expected rate of the input serial data stream may be set by a parameter which, in a hardware implementation, may be simply wires connected to power or ground to set a selection code or may be a parameter that is changeable depending on the application. The process goes to step S102.

In step S102, the process selects the sampling points. The process goes to step S104. In step S104, the process samples the input serial data stream using the sample points selected in step S102. The sampled data may be serially shifted into a shift register, for example, and the data in the shift register may be made available to the comparators for detecting the presence of edge transitions and for an output selector within the sampler 46 to select appropriate ones of the sampled data for output as the serial output data stream. The shift register may be a register in a processor if micro or pico code is used. The process goes to step S106. In step S106, the process determines whether communication is completed. If completed, the process goes to step S108 and ends; otherwise the process returns to step S104 and continue sampling the input serial data stream. If implemented in hardware, this step would not be necessary, since when all possible communication is completed, power would simply be turned off and the process ends.

FIG. 8 shows an flow chart for another exemplary initialization and sampling process of the CDR. In step S110, the process initializes the CDR by setting the expected rate of the input serial data stream and initializes the counter 54 to an initial value. The process goes to step S112.

In step S112, the process samples the input serial data stream. The process goes to step S114. In step S114, the sampled data bits are stored in a register. The process goes to step S116. In step S116, the process extract directives and select one based on the set data rate in step S110. Then in step S118, the process determines whether communication is completed. If completed, the process goes to step S120 and ends; otherwise the process returns to step S112 and repeats the steps S112 through S118.

FIG. 8 shows a flow chart for an exemplary decision process in a CDR. In step S200, the process compares a plurality of consecutive sampled data. The process goes to step S202. In Step S202, the process determines whether an edge transition is present. As discussed above, an edge transition is detected when a pair of consecutive sampled data bits have different values. If an edge transition is detected, the process goes to step S204; otherwise the process goes to step S214.

In step S204, the process determines whether fast-lock mode is enabled. If enabled, the process goes to step S206; otherwise the process goes to step S208. As discussed above, the fast-lock process changes a phase step size so that convergence to the synchronization point may be achieved at a faster rate. In step S206, the process determines an appropriate phase step size. The phase step size for the fast-lock mode may be set to a fixed value such as 45 degrees, for example. Alternatively, the process may adjust the step size based on specific parameters such as the number of contiguous clock cycles the CDR is in the fast-lock mode, or the number of times the fast-lock mode was used so far during the current communication. The process goes to step S208.

In step S208, the process determines whether a phase lag or phase lead condition was detected. A phase lead condition indicates that the sample point 0 is occurred before the edge transition and a phase lag condition indicates that the sample point 0 occurred after the edge transition. If a phase lag condition is detected, the process goes to step S212; otherwise the process goes to step S210. In step S210, the process increments the counter 54 by the current step size; and in step S212, the process decrements the counter 54 by the current step size and the process goes to step S214. The step S214, the process determines whether the communication is completed. If completed, the process goes to step S216 and ends; otherwise the process returns to step S200.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method for recovering data, comprising:
   sampling a serial data stream to generate sampled data bits;
   comparing sampled data bits to detect an edge transition; and
   reducing false locks by setting a size of increase or decrease of a phase shift based on a zone in which the edge transition is detected, the size being set to a first value if the zone is a lock zone and to a second value if the zone is a far-to-lock zone.

2. The method of claim 1, further comprising:
   continuously maintaining the size of increase or decrease of the phase shift to the second value if the edge transition is continuously detected in the far-to-lock zone.

3. The method of claim 1, further comprising:
   adjusting the second value based on a number of consecutive times that the far-to-lock zone is set.

4. The method of claim 1, further comprising:
   storing the sampled data bits;
   generating directives; and
   selecting relevant directives based on one of a plurality of rates of the serial data stream.

5. The method of claim 1, further comprising:
   selecting a set of a plurality of sampling points based on one of a plurality of rates of the serial data stream.

6. The method of claim 5, further comprising:
   generating a clock;
   generating a plurality phase shifted clocks based on the clock; and
   selecting an edge of each of one or more of the phase shifted clocks as the plurality of sampling points.

7. The method of claim 6, further comprising:
   sampling the serial data stream at the sampling points;
   comparing consecutive samples of the serial data stream to generate compare results; and
   changing a phase shift of the phase shifted clocks based on the compare results.

8. The method of claim 6, further comprising:
   setting a clock rate of the clock to be at a selected rate;
   selecting two sampling points for a rate of the serial data stream that is twice the selected rate; and
   selecting four sampling points for rates of the serial data stream that are equal to or less than the selected rate.

9. The method of claim 8, further comprising:
   selecting an edge of each of two phase shifted clocks to be the sampling points for a rate of the serial data stream that is half the selected rate; and
   selecting an edge of one of the phase shifted clocks to be the sampling points for a rate of the serial data stream that is one quarter of the selected rate.

10. An apparatus to recover data, comprising:
    a sampler that samples a serial data stream to generate sampled data bits;

at least one comparator that compares sampled data bits to detect an edge transition; and a controller that reduces false locks by setting a size of increase or decrease of a phase shift based on a zone in which the edge transition is detected, the size being set to a first value if the zone is a lock zone and to a second value if the zone is a far-to-lock zone.

11. The apparatus of claim 10, wherein
the controller continuously maintains the size of increase or decrease of the phase shift to the second value if the edge transition is continuously detected in the far-to-lock zone.

12. The apparatus of claim 10, wherein
the controller adjusts the second value based on a number of consecutive times that the far-to-lock zone is set.

13. The apparatus of claim 10, further comprising:
at least one memory that stores the sampled data bits; and
a directive extractor that extracts directives from the sampled data bits; and
a directive selector that selects relevant directives based on one of a plurality of rates of the serial data stream.

14. The apparatus of claim 10, further comprising:
a selector that selects a set of a plurality of sampling points based on one of a plurality of rates of the serial data stream.

15. The apparatus of claim 14, further comprising:
a clock generator that generates a clock;
at least one phase rotator that generates a plurality phase shifted clocks based on the clock, wherein an edge of each of one or more of the phase shifted clocks are used as the plurality of sampling points.

16. The apparatus of claim 15, wherein
the sampler samples the serial data stream at the sampling points;
the comparator compares consecutive samples of the serial data stream to generate compare results; and
the controller causes a phase shift of the phase shifted clocks based on the compare results.

17. The apparatus of claim 15, wherein
the selector selects two sampling points for a rate of the serial data stream that is twice a selected clock rate of the clock generator; and the selector selects four sampling points for rates of the serial data stream that are equal to or less than the selected rate of the clock generator.

18. The apparatus of claim 17, wherein
the selector selects an edge of each of two phase shifted clocks to be the sampling points for a rate of the serial data stream that is half the selected rate; and
the selector selects an edge of one of the phase shifted clocks to be the sampling points for a rate of the serial data stream that is one quarter of the selected rate.

19. A system or network that includes the apparatus of claim 10.

20. An apparatus to recover data, comprising:
means for sampling a serial data stream to generate sampled data bits;
means for selecting relevant sampled data bits based on one of a plurality of rates of the serial data stream;
means for comparing sampled data bits to detect an edge transition; and
means for reducing false locks by setting a size of increase or decrease of a phase shift based on a zone in which the edge transition is detected, the size being set to a first value if the zone is a lock zone and to a second value if the zone is a far-to-lock zone.

21. A method for recovering data by reducing false locks, comprising:
sampling a serial data stream to generate sampled data bits;
locating the data edge during a lock acquisition to accelerate the data edge by increasing or decreasing the size of a phase shift;
comparing sampled data bits to detect an edge transition; and
setting a size of increase or decrease of a phase shift based on a zone in which the edge transition is detected, the size being set to a first value if the zone is a lock zone and to a second value if the zone is a far-to-lock zone.

* * * * *